(12) United States Patent
Moon et al.

(10) Patent No.: US 9,930,799 B2
(45) Date of Patent: Mar. 27, 2018

(54) ELECTRONIC DEVICE INCLUDING A FUNCTION OF WATER PROOF AND COVER THEREOF

(71) Applicant: Samsung Electronics Co., Ltd., Gyeonggi-do (KR)

(72) Inventors: Hee Cheul Moon, Gyeonggi-do (KR); Min Sung Lee, Gyeonggi-do (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 326 days.

(21) Appl. No.: 14/671,913

(22) Filed: Mar. 27, 2015

(65) Prior Publication Data

US 2015/0282364 A1    Oct. 1, 2015

(30) Foreign Application Priority Data

Mar. 27, 2014    (KR) .................. 10-2014-0035841

(51) Int. Cl.
*H05K 5/06*    (2006.01)
*H04M 1/18*    (2006.01)

(52) U.S. Cl.
CPC .............. *H05K 5/061* (2013.01); *H04M 1/18* (2013.01)

(58) Field of Classification Search
CPC .................................. H05K 5/061; H04M 1/18
USPC ........................................................... 174/520
See application file for complete search history.

(56) References Cited

U.S. PATENT DOCUMENTS

| 8,804,993 | B2 * | 8/2014 | Shukla | ................ | B29C 45/1671 |
| | | | | | 381/189 |
| 2008/0081679 | A1 * | 4/2008 | Kawasaki | ............ | H04B 1/3888 |
| | | | | | 455/575.8 |

FOREIGN PATENT DOCUMENTS

KR    10-2013-0016705    2/2013

* cited by examiner

*Primary Examiner* — Dhirubhai R Patel

(57) ABSTRACT

Disclosed is an electronic device having a waterproof function. The electronic device includes a housing in which a coupling groove is formed, a cover including a hook detachably fit to the coupling groove, the cover configured to detachably couple to the housing by the hook, and a sealing band disposed on an inner side of the cover configured to contact at least a part of a surface of the housing which faces the cover when the cover is coupled to the housing, wherein the sealing band has a rib extending towards the housing, at least a part of the rib being bent in a specific direction. Other embodiments derived from the specification are possible.

20 Claims, 5 Drawing Sheets

ELECTRONIC DEVICE INCLUDING A FUNCTION OF WATER PROOF AND COVER THEREOF

CROSS-REFERENCE TO RELATED APPLICATION AND CLAIM OF PRIORITY

The present application is related to and claims priority to Korean patent application No. 10-2014-0035841 filed Mar. 27, 2014, the disclosure of which is hereby incorporated in its entirety by reference, is claimed.

TECHNICAL FIELD

Various embodiments of the present disclosure relate to an electronic device having a waterproof function.

BACKGROUND

Electronic devices are required to be waterproof so as to be used normally under various humidity or temperature conditions, for example, under rainy or snowy weather conditions.

A sealing member is commonly disposed in a gap of an electronic device through which water or moisture may permeate in order to waterproof the electronic device.

SUMMARY

An electronic device is commonly provided with a housing and a cover coupled thereto, but a gap can exist between the housing and the cover through which water can permeate. Therefore, the gap between the housing and the cover is blocked by a sealing member disposed on an inner side of the cover, thereby waterproofing the electronic device.

A protrusion formed on the inner side of the cover is fit to a groove formed in the housing so that the cover is coupled to the housing. While the cover is coupled to the housing, the sealing member is pressed by a surface of the housing and is thus deformed.

The sealing member pressed by the surface of the housing has a resilience that presses the surface of the housing in a direction in which the protrusion is drawn from the groove. In other words, the resilience of the sealing member can detach the cover from the housing.

In order to prevent the cover from being detached from the housing by the resilience of the sealing member, an engagement amount of the protrusion fit to the groove is increased. However, in certain embodiments, the protrusion may not be easily drawn from the groove while the cover is detached from the housing. Moreover, the protrusion can be broken or the cover can be cracked if the protrusion is forcibly drawn from the groove.

That is, the cover can become easily loose from the housing if the engagement amount of the protrusion is too small, and the protrusion or the cover can be damaged if the engagement amount of the protrusion is too large. Therefore, the looseness of or damage to the cover may not be prevented.

To address the above-discussed deficiencies, it is a primary object to provide an electronic device having a waterproof function and a cover thereof, the electronic device securing the cover to a housing while reducing damage to the cover.

According to certain embodiments of the present disclosure, an electronic device includes a housing in which a coupling groove is formed, a cover including a hook configured to detachably fit to the coupling groove, the cover is detachably coupled to the housing by the hook, and a sealing band disposed on an inner side of the cover configured to seal a surface of the housing which faces the cover, wherein the sealing band includes a rib extending towards the housing, the rib configured with a bend towards an inside of an area surrounded by the sealing band.

According to certain embodiments of the present disclosure, an electronic device includes a housing in which a coupling groove is formed, a cover including a hook configured to detachably fit to the coupling groove, the cover configured to detachably couple to the housing by the hook, and a sealing band disposed on an inner side of the cover configured to seal a surface of the housing which faces the cover, wherein the sealing band includes a rib extending towards the housing, the rib configured with a bend in an opposite direction to a direction in which the hook is drawn from the coupling groove.

According to certain embodiments of the present disclosure, an electronic device includes a housing in which a coupling groove is formed, a cover including a hook configured to detachably fit to the coupling groove, the cover configured to detachably couple to the housing by the hook, and a sealing band disposed on an inner side of the cover configured to seal a surface of the housing which faces the cover, wherein the sealing band includes a rib extending towards the housing, wherein the rib is configured to apply force to the cover in a direction in which the cover is pulled from the housing while the cover is coupled to the housing, wherein the direction in which the cover is pulled from the housing intersects with a direction in which the hook is drawn from the coupling groove.

According to certain embodiments of the present disclosure, a cover of an electronic device including a waterproof function includes a hook protruding from an inner side having a flat central portion and an edge area bent at a constant or specific angle, the hook disposed on the bent edge area configured to be inserted into a coupling groove formed in a housing of a main body, and a sealing band configured to protrude from the inner side, the sealing band spaced apart from the hook by a constant or specific distance, wherein the sealing band includes a rib protruding from the inner side, the rib configured to incline in a constant or specific direction.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
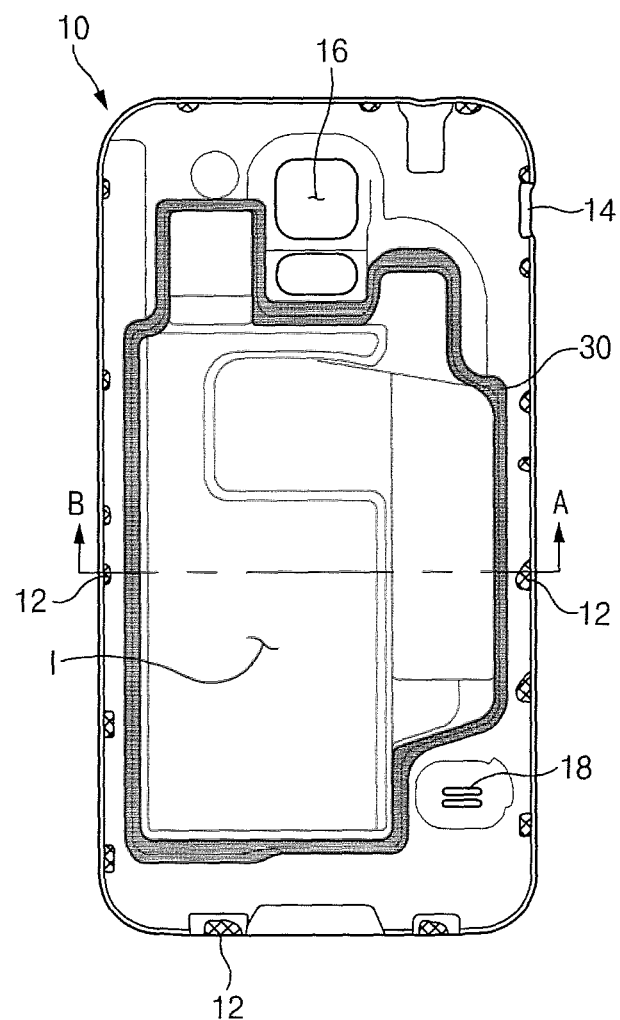
FIG. 1 illustrates a cover of an electronic device seen from the inside thereof according to one of various embodiments of the present disclosure.

FIGS. 1 through 5, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless communication system. Hereinafter, various embodiments of the present disclosure will be described with reference to the accompanying drawings. The present disclosure may be variously modified and may include various embodiments. However, specific embodiments are exemplarily illustrated in the drawings and detailed descriptions related thereto are provided herein. However, it should be understood that the various embodiments of the present disclosure are not limited to specific examples but rather include all modifications, equivalents and alternatives that fall within the spirit and scope of the various embodiments of the present disclosure. Regarding the drawings, like reference numerals refer to like elements.

The term "include," "comprise," "including," or "comprising" used herein indicates disclosed functions, operations, or existence of elements but does not exclude other functions, operations or elements. It will be further understood that the terms "comprise", "comprising,", "include", "including", "have" and/or "having", when used herein, specify the presence of stated features, numbers, steps, operations, elements, components or combinations thereof, but do not preclude the presence or addition of one or more other features, numbers, steps, operations, elements, components or combinations thereof.

The meaning of the term "or" used herein includes any combination of words connected by the term "or". For example, the expression "A or B" can indicate A, B, or both A and B.

The terms such as "first", "second" and the like used herein refer to various elements of the present disclosure, but do not limit the elements. For example, such terms do not limit the order and/or priority of the elements. Furthermore, such terms can be used to distinguish one element from another element. For example, "a first user device" and "a second user device" indicate different user devices. For example, without departing the scope of the various embodiments of the present disclosure, a first element can be referred to as a second element and vice versa.

It will be understood that when an element is referred to as being "connected", "coupled" or "fastened" to another element, it can be directly connected, coupled or fastened to the other element or intervening elements may be present. In contrast, when an element is referred to as being "directly connected", "directly coupled" or "directly fastened" to another element, it should be understood that there are no intervening elements.

The terminology used herein is not for limiting the present disclosure but for describing specific embodiments. The terms of a singular form can include plural forms unless otherwise specified.

The terms used herein, including technical or scientific terms, have the same meanings as understood by those skilled in the art. The commonly used terms such as those defined in a dictionary should be interpreted in the same context as in the related art and should not be interpreted in an idealized or overly formal sense unless otherwise defined explicitly.

An electronic device according to the present disclosure includes at least one of a smartphone, a tablet personal computer (PC), a mobile phone, a video telephone, an electronic book reader, a desktop PC, a laptop PC, a netbook computer, a personal digital assistant (PDA), a portable multimedia player (PMP), an MP3 player, a mobile medical device, a camera or a wearable device (e.g., a head-mounted-device (HMD) such as electronic glasses, electronic apparel, an electronic bracelet, an electronic necklace, an electronic appcessory, an electronic tattoo or a smartwatch).

According to various embodiments, the electronic device is a smart home appliance. The smart home appliance includes at least one of, for example, a TV, a DVD player, an audio, a refrigerator, an air conditioner, a cleaner, an oven, a microwave oven, a washing machine, an air cleaner, a set-top box, a TV box (e.g., a SAMSUNG HOME SYNC® box, APPLE TV® box, or GOOGLE TV® box), a game console, an electronic dictionary, an electronic key, a camcorder, or an electronic picture frame.

According to various embodiments, the electronic device includes at least one of a medical device (e.g., magnetic resonance angiography (MRA), magnetic resonance imaging (MRI), computed tomography (CT), a scanner or an ultrasonic device), a navigation device, a global positioning system (GPS) receiver, an event data recorder (EDR), a flight data recorders (FDR), a vehicle infotainment device, electronic equipment for ship (e.g., a navigation system or a gyrocompass), avionics, a security device, a head unit for a vehicle, an industrial or home robot, an automatic teller's machine (ATM), or a point of sales (POS).

According to some embodiments, the electronic device include at least one of a part of furniture or a building or structure, an electronic board, an electronic signature receiving device, a projector, or measuring instruments (such as water meters, electricity meters, gas meters, or wave meters). The electronic device according to the present disclosure can be one or a combination of the above-mentioned devices. Furthermore, the electronic device according to the present disclosure can be a flexible device. It would be obvious to those skilled in the art that the electronic device according to the present disclosure is not limited to the above-mentioned devices.

Hereinafter, the electronic devices according to the various embodiments will be described with reference to the accompanying drawings. The term "user" used herein can refer to a person who uses an electronic device or can refer to a device (such as an artificial electronic device) that uses an electronic device.

Figure 2:
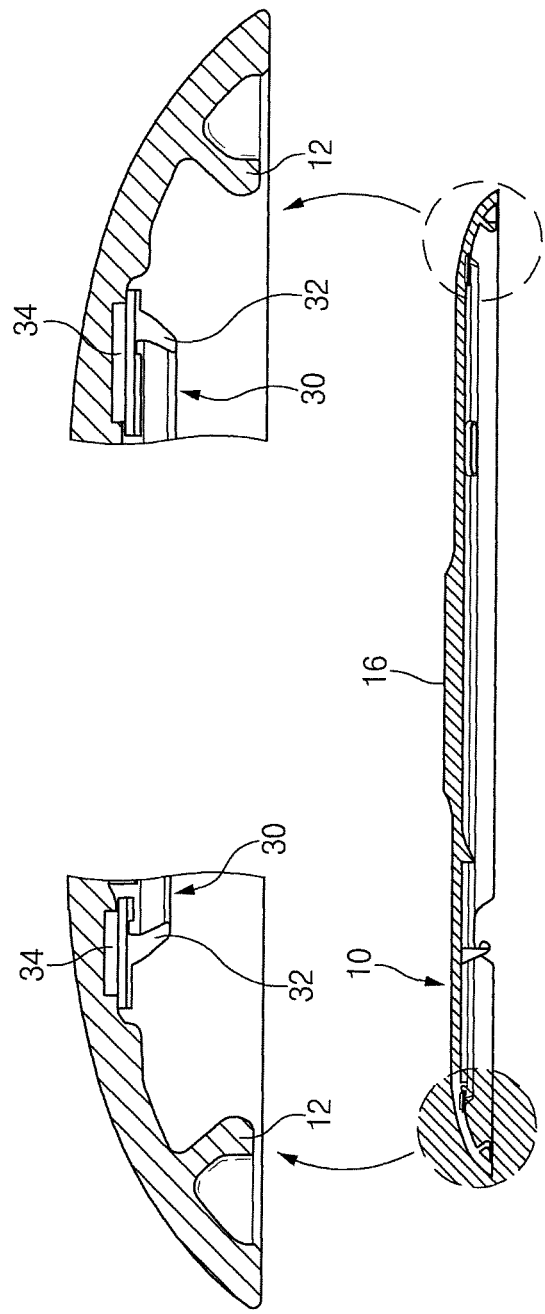
FIG. 2 illustrates a cross section of the cover taken along line A-B of FIG. 1 and a partial magnified view of the cover according to one of various embodiments of the present disclosure.
Figure 3:
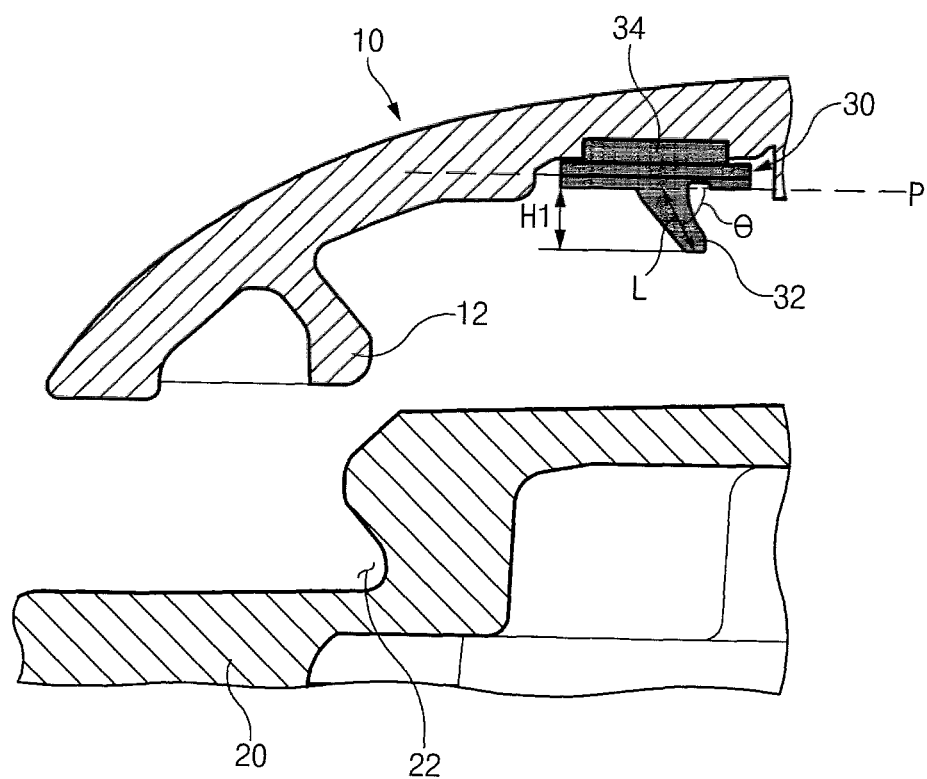
FIG. 3 illustrates the electronic device in which the cover is detached from a housing according to one of various embodiments of the present disclosure.
Figure 4:
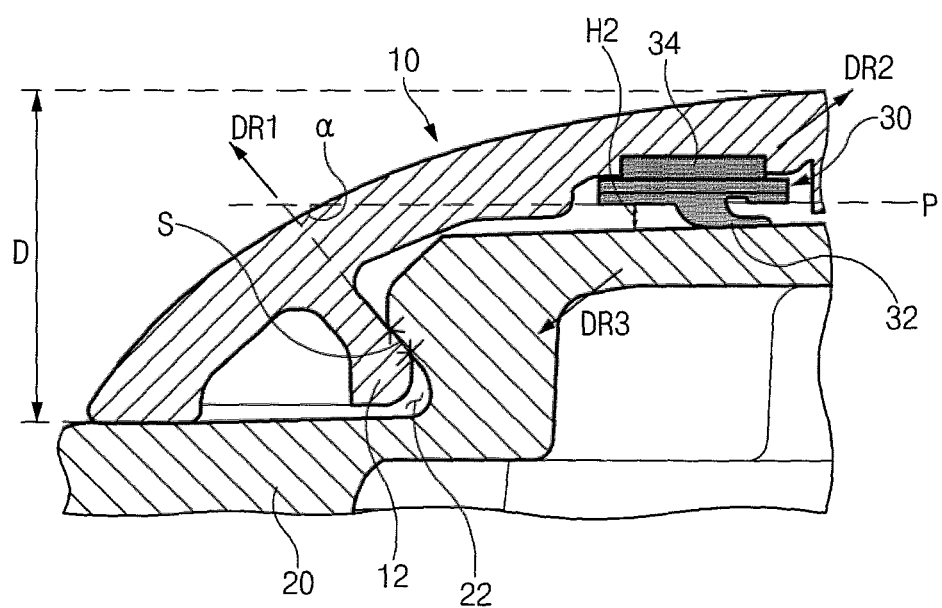
FIG. 4 illustrates the electronic device in which the cover is coupled to the housing according to one of various embodiments of the present disclosure.

FIG. 1 illustrates a cover of an electronic device seen from the inside thereof according to one of various embodiments of the present disclosure. FIG. 2 illustrates a cross section of the cover taken along line A-B of FIG. 1 and a partial magnified view of the cover according to one of various embodiments of the present disclosure. FIG. 3 illustrates a partial cross section view of the electronic device in which the cover is detached from a housing according to one of various embodiments of the present disclosure. FIG. 4 illustrates a partial cross section of the electronic device in which the cover is coupled to the housing according to one of various embodiments of the present disclosure.

Referring to FIGS. 1-4, the electronic device, according to one of the various embodiments of the present disclosure, includes a housing 20 in which a coupling groove 22 is formed (see FIG. 3 or 4), a cover 10 which includes a hook 12 detachably fit to the coupling groove 22 and is detachably coupled to the housing 20 by the hook 12, and a sealing band 30 disposed on an inner surface of the cover 10 to seal a surface of the housing 20 facing the cover 10.

Various electronic and mechanical components that are included in the electronic device are installed in the housing 20, and the housing 20 forms a general outward appearance of the electronic device. For example, a display unit, a battery, a PCB, a camera module, a speaker, a control button and a switch are disposed in the housing 20.

A pulling groove 14 for detaching the cover 10 from the housing 20 while the cover 10 is coupled to the housing 20 is formed in the cover 10, and a camera hole 16 for exposing at least a part of a camera to the outside is formed in the cover 10 in the case where the camera module is disposed in the housing 20. Furthermore, in the case where the speaker is disposed in the housing 20, a speaker hole 18 is formed in the cover 10.

As illustrated in FIG. 1, the sealing band 30 forms a closed curve. In certain embodiments, various components of the electronic device arranged on an area I surrounded by the sealing band 30 are protected from external moisture or water drops. The sealing band 30 includes a rib 32 extending toward the housing 20, wherein the rib 32 is bent toward an inner side of the area I surrounded by the sealing band 30. Depending on a viewpoint, the rib 32 is considered to be bent in an opposite direction to a direction in which the hook 12 is detached from the coupling groove 22.

The sealing band 30 is attached to the inner side of the cover 10 by means of an adhesive layer 34, wherein the adhesive layer 34 includes a waterproof double-sided tape or a layer of an adhesive that is applied to at least one of the inner side of the cover 10 and a surface of the sealing band 30.

While the cover 10 is coupled to the housing 20, an end portion of the rib 32 disposed on the sealing band 30 contacts the surface of the housing 20 facing the cover (see FIG. 4). In certain embodiments, the sealing band 30 surrounds an edge of at least a part of the surface of the housing 20 facing the cover. The cover 10 is coupled to the housing 20, with the rib 32 being pressed and bent by the housing 20.

The hook 12 is disposed on the inner side of the cover 10 so as to protrude in a similar or parallel direction to the extending direction of the rib 32. In certain embodiments, the protruding direction of the hook 12 is based on a surface of the hook 12 which contacts the coupling groove 22 (see FIG. 4). Furthermore, while the hook 12 is fit to the coupling groove 22, the surface of the hook 12 which contacts the coupling groove 22 is structured with a similar or parallel direction to the extending direction of the rib 32.

While the cover 10 is detached from the housing 20, an angle θ between the rib 32 and a plane P defined by the area I surrounded by the sealing band 30 be from about 60° to about 70°. Therefore, the cover 10 may be coupled to the housing 20, with the rib 32 being pressed and bent by the housing 20.

An angle α between the plane P defined by the area I surrounded by the sealing band 30 and the interfacial surface between the hook 12 and the coupling groove 22 be from about 40° to about 60°.

The rib 32 have such a length as to be pressed and bent by the housing 20 when the cover 10 is coupled to the housing 20, so that the rib 32 is elastically deformed to tightly contact the surface of the housing 20 when the cover 10 is coupled to the housing 20. However, if a length L of the rib 32 is too large, a large weight is loaded on the hook 12 due to the resilience of the rib 32. Due to the weight on the hook 12, an amount of engagement of the hook 12 with the coupling groove 22 needs to be increased to prevent the hook 12 from easily slipping out of the coupling groove 22.

When the length L of the rib 32 is less than about 1.4 mm, the hook 12 does not easily slip out of the coupling groove 22 without excessively increasing the amount of engagement of the hook 12 with the coupling groove 22, while the rib 32 sufficiently seals the surface of the housing 20. Therefore, the length L of the rib 32 be less than about 1.4 mm. In certain embodiments, the length L of the rib 32 is measured along the extending direction of the rib 32 as illustrated in FIG. 3.

The sealing band 30 is formed of a material such as an elastic synthetic resin, rubber or silicone, and molded by injection molding. In certain embodiments, the rib 32 protruding from the sealing band 30 does not extend directly downwards, but extends slantly right or dextrally downwards as illustrated in FIG. 3. When the sealing band 30 molded by injection molding is separated from a mold, the rib 32 not be easily separated from the mold or be stretched and deformed while being stuck in the mold, or an end portion of the rib 32 be broken.

In the various embodiments of the present disclosure, the length L of the rib 32 be set not to be excessively large in order to avoid the occurrence of the above-mentioned problem when the sealing band 30 is separated from the mold, wherein the length L of the rib 32 be set to be less than about 1.4 mm in consideration of a process of manufacturing the sealing band 30. In consideration of not only the amount of engagement of the hook 12 with the coupling groove 22 but also the process of manufacturing the sealing band 30, the length L of the rib 32 is less than about 1.4 mm.

A height H2 of the rib 32 measured from a surface of the cover 10 when the rib 32 is bent since the cover 10 is coupled to the housing 20 (see FIG. 4) is smaller than a height H1 of the rib 32 measured from the surface of the cover 10 when the rib 32 is not deformed since the cover 10 is detached from the housing 20 (see FIG. 3). A small difference between the height H1 and the height H2 indicates that the rib 32 is not sufficiently deformed so that the rib 32 sufficiently tightly contacts the surface of the housing 20, whereas a large difference between the height H1 and the height H2 indicates that the rib 32 applies a large amount of resilience to the housing 20 so that the cover 10 highly possibly slips out of the housing 20. In consideration of these issues, the height H2 can be smaller than the height H1 by about 0.25-0.35 mm.

A height D of the cover 10 is measured from a parting surface that is a boundary between the cover 10 and the housing 20, and a hook engagement amount S is defined as a length of the interfacial surface between the hook 12 and the coupling groove 22 measured along the protruding direction of the hook 12 while the hook 12 is fit to the coupling groove 22. As the height D of the cover 10 increases, the elasticity of the cover 10 is degraded. As the height D of the cover 10 increases, it can be more difficult to detach the cover 10 from the housing 20, since the hook 12 is not easily drawn from the coupling groove 22. When the height D of the cover 10 is large, the hook engagement amount S needs to be small so that the cover 10 is easily detached from the housing 20. When the hook engagement amount S is small, the cover 10 can be unintentionally detached from the housing 20. The height D of the cover 10 can be determined to be from about 1.5 mm to about 2.0 mm to make the electronic device thin, and, on the basis of this height, the hook engagement amount S can be from about 0.15 mm to about 0.17 mm. When the hook engagement amount S falls within the above-mentioned numerical range, the cover 10 can be easily detached from the housing 20 without cracking the cover 10 or damaging the hook 12, while not easily and unintentionally able to slip out of the coupling groove 22.

Referring to FIG. 4, while the cover 10 is coupled to the housing 20, the rib 32 applies force to the cover 10 in a direction DR2 in which the cover 10 is pulled from the housing 20, while pressing, in a direction DR3, the surface of the housing 20 which faces the cover 20. The direction DR2 in which the rib 32 pushes the cover 10 against the housing 20 intersects with a direction DR1 in which the hook 12 is drawn from the coupling groove 22. Even though the rib 32 applies the resilience to the surface of the housing 20 which faces the cover 10, the hook 12 does not slip out of the coupling groove 22 in the direction DR1. The hook engagement amount S does not need to be large. In the case where the hook engagement S is not large, the hook 12 and the cover 10 are prevented from being cracked or damaged when the cover 10 is detached from the housing 20.

As described above, the various embodiments of the present disclosure provide an electronic device for securing the cover 10 to the housing 20 and reducing damage to the cover 10.

As described above, in the various embodiments of the present disclosure, a sealing band is disposed on one side of a cover in order to support a waterproof function of the electronic device. A cover of an electronic device having a waterproof function according to certain embodiments of the present disclosure includes a hook protruding from an inner side having a flat central portion and an edge area bent at a constant (or specific) angle, the hook being disposed on the bent edge area so as to be inserted into a coupling groove formed in a housing of a main body, and a sealing band protruding from the inner side, the sealing band being spaced apart from the hook by a constant (or specific) distance without overlapping in reference to a virtual vertical line, wherein the sealing band includes a rib protruding from the inner side, the rib being inclined in a constant (or specific) direction. The cover further includes an adhesive layer for fixing the rib to the inner side.

At least a part of the rib is bent in an opposite direction to a direction in which the hook is drawn from the coupling groove or is bent towards an inside of an area surrounded by the sealing band. The rib applies force to the cover in a direction in which the cover is pulled from the housing while the cover is coupled to the housing, wherein the direction in which the cover is pulled from the housing intersects with the direction in which the hook is drawn from the coupling groove. The rib is inclined at an angle of, for example, about 60° to about 70° with respect to a plane defined by the area surrounded by the sealing band while the cover is detached from the housing, and a height of the rib measured from the inner side of the cover, when the cover is coupled to the housing and the rib is deformed, is smaller than a height of the rib measured before the rib is deformed by about 0.25 mm to about 0.35 mm. A height difference between an end of the edge area and the central portion due to bending of the cover can be about 1.5 mm to about 2.0 mm.

Figure 5:
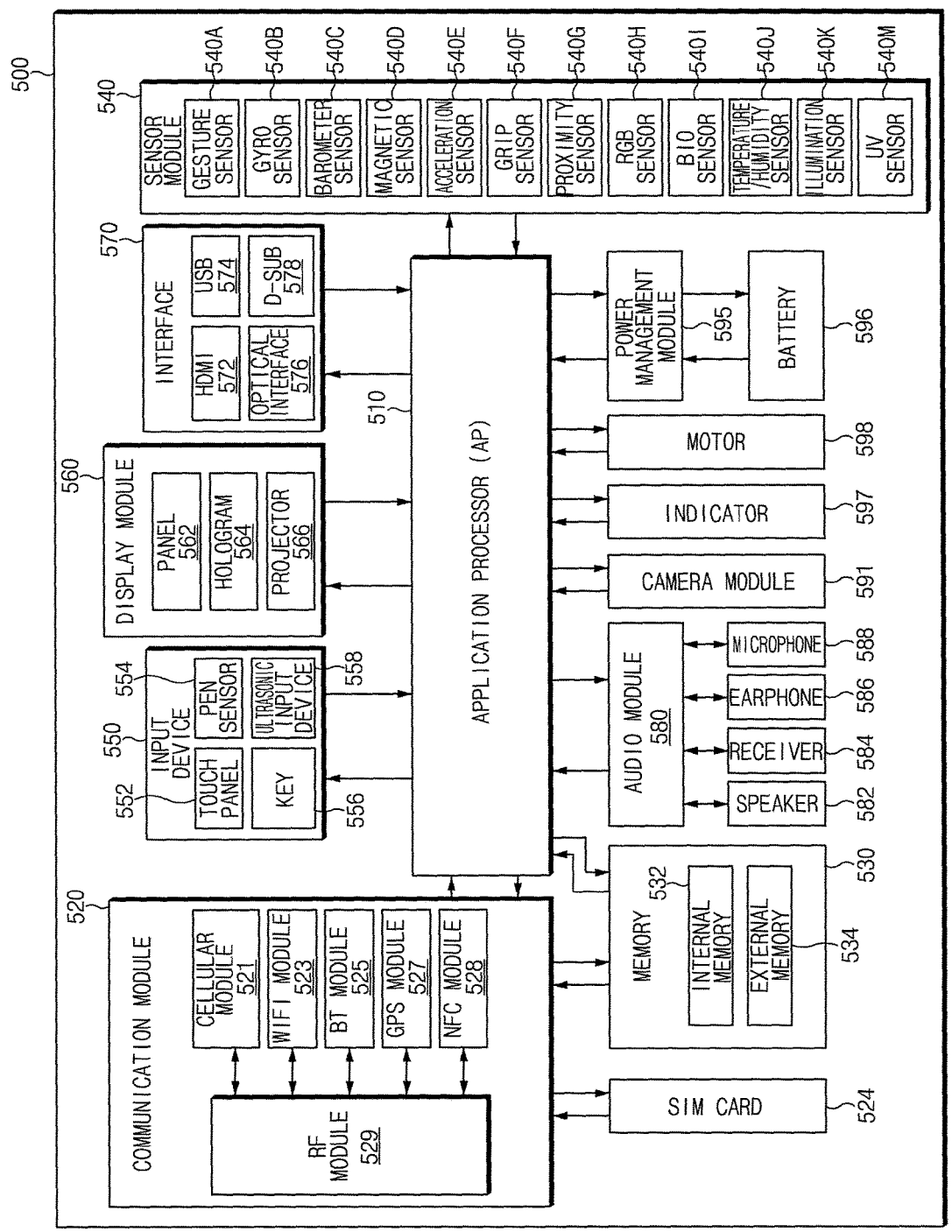
FIG. 5 illustrates an electronic device according to the various embodiments of the present disclosure.

FIG. 5 illustrates an electronic device according to the various embodiments of the present disclosure. An electronic device 501 constitutes, for example, a part or the entirety of the electronic device according to the various embodiments of the present disclosure described above. Referring to FIG. 5, the electronic device 501 includes at least one application processor (AP) 510, a communication module 520, a subscriber identification module (SIM) card 524, a memory 530, a sensor module 540, an input device 550, a display 560, an interface 570, an audio module 580, a camera module 591, a power management module 595, a battery 596, an indicator 597 and a motor 598.

The AP 510 runs an operating system or an application program so as to control a plurality of hardware or software components connected to the AP 510, and process various data including multimedia data and perform an operation. The AP 510 be implemented with, for example, a system on chip (SoC). According to certain embodiments, the AP 510 further includes a graphic processing unit (GPU, not illustrated).

The communication module 520 performs data transmission/reception for communication between the electronic device 501 and other electronic devices connected thereto through a network. According to certain embodiments, the communication module 520 includes a cellular module 521, a Wi-Fi module 523, a BT module 525, a GPS module 527, an NFC module 528, and a radio frequency (RF) module 529.

The cellular module 521 provides a voice call service, a video call service, a text message service, or an Internet service through a communications network (such as LTE, LTE-A, CDMA, WCDMA, UMTS, WiBro or GSM network). The cellular module 521 identifies and authenticates electronic devices in the communications network using, for example, a subscriber identification module (such as the SIM card 524). According to certain embodiments, the cellular module 521 performs at least a part of functions provided by the AP 510. For example, the cellular module 521 performs at least a part of a multimedia control function.

According to certain embodiments, the cellular module 521 includes a communication processor (CP). The cellular module 521 is implemented with, for example, an SoC.

According to certain embodiments, the AP 510 or the cellular module 521 (such as a communication processor) loads, on a volatile memory, a command or data received from a nonvolatile memory connected to the AP 510 or the cellular module 521 or at least one of other elements, so as to process the command or data. The AP 510 or the cellular module 521 stores, in the nonvolatile memory, data received from or generated by at least one of the other elements.

Each of the Wi-Fi module 523, the BT module 525, the GPS module 527 and the NFC module 528 includes, for example, a processor for processing data transmitted/received through the modules. According to certain embodiments, at least a part (such as two or more) of the cellular module 521, the Wi-Fi module 523, the BT module 525, the GPS module 527 and the NFC module 528 be included in a single integrated chip (IC) or IC package. For example, at least a part (such as a communication processor corresponding to the cellular module 521 and a Wi-Fi processor corresponding to the Wi-Fi module 523) of processors corresponding to the cellular module 521, the Wi-Fi module 523, the BT module 525, the GPS module 527 and the NFC module 528 be implemented with a single SoC.

The RF module 529 transmits or receives data, for example, transmits or receives RF signals. Although not illustrated, for example, a transceiver, a power amp module (PAM), a frequency filter or a low noise amplifier (LNA) are included in the RF module 529. The RF module 529 further includes a component such as a conductor or a wire for transmitting or receiving free-space electromagnetic waves in a wireless communication system. According to certain embodiments, at least one of the cellular module 521, the Wi-Fi module 523, the BT module 525, the GPS module 527 and the NFC module 528 transmits or receives RF signals through a separate RF module.

The SIM card 524 includes a subscriber identification module, and is inserted into a slot formed at a specific location of the electronic device. The SIM card 524 includes unique identification information (such as an integrated circuit card identifier (ICCID)) or subscriber information (such as international mobile subscriber identity (IMSI)).

The memory 530 includes an internal memory 532 or an external memory 534. The internal memory 532 includes at least one of a volatile memory (such as a dynamic RAM (DRAM), a static RAM (SRAM) or a synchronous dynamic RAM (SDRAM)) and a nonvolatile memory (such as a one-time programmable ROM (OTPROM), a programmable ROM (PROM), an erasable and programmable ROM (EPROM), an electrically erasable and programmable ROM (EEPROM), a mask ROM, a flash ROM, a NAND flash memory, or a NOR flash memory).

According to certain embodiments, the internal memory 532 is a solid state drive (SSD). The external memory 534 includes a flash drive, for example, compact flash (CF), secure digital (SD), micro secure digital (Micro-SD), mini secure digital (Mini-SD), extreme digital (xD) or a memory stick. The external memory 534 is functionally connected to the electronic device 501 through various interfaces. According to certain embodiments, the electronic device 501 further includes a storage device (or a storage medium) such as a hard drive.

The sensor module 540 measures physical quantity or detect an operation state of the electronic device 501 so as to convert measured or detected information into an electrical signal. The sensor module 540 includes, for example, at least one of a gesture sensor 540A, a gyro sensor 540B, an atmospheric pressure sensor 540C, a magnetic sensor 540D, an acceleration sensor 540E, a grip sensor 540F, a proximity sensor 540G, a color sensor 540H (such as an RGB (red, green and blue) sensor), a biometric sensor 540I, a temperature/humidity sensor 540J, an illuminance sensor 540K, and an ultraviolet (UV) sensor 540M. In certain embodiments, the sensor module 540 includes, for example, an olfactory sensor (E-nose sensor, not illustrated), an electromyography (EMG) sensor (not illustrated), an electroencephalogram (EEG) sensor (not illustrated), an electrocardiogram (ECG) sensor (not illustrated), an infrared (IR) sensor (not illustrated), an iris recognition sensor (not illustrated), or a fingerprint sensor (not illustrated). The sensor module 540 further includes a control circuit for controlling at least one sensor included therein.

The input device 550 includes a touch panel 552, a digital pen sensor 554, a key 556, or an ultrasonic input device 558. The touch panel 552 recognizes a touch input using at least one of capacitive, resistive, infrared and ultraviolet sensing methods. The touch panel 552 further includes a control circuit. When using the capacitive sensing method, a physical contact recognition or proximity recognition is allowed. The touch panel 552 further includes a tactile layer. In certain embodiments, the touch panel 552 provides tactile reaction to a user.

The digital pen sensor 554 be implemented in a similar or same manner as that for receiving a touch input of a user, or be implemented using an additional sheet for recognition. The key 556 includes, for example, a physical button, an optical button, or a keypad. The ultrasonic input device 558 enables the electronic device 501 to sense, through a microphone (such as a microphone 588), sound waves from an input tool that generates ultrasonic signals so as to identify data, wherein the ultrasonic input device 558 is capable of wireless recognition. According to certain embodiments, the electronic device 501 uses the communication module 520 so as to receive a user input from an external device (such as a computer or a server) connected to the communication module 520.

The display 560 includes a panel 562, a hologram device 564, or a projector 566. The panel 562 is, for example, a liquid crystal display (LCD) or an active-matrix organic light-emitting diode (AM-OLED). The panel 562 is, for example, flexible, transparent or wearable. The panel 562 and the touch panel 552 is integrated into a single module. The hologram device 564 displays a stereoscopic image in a space using a light interference phenomenon. The projector 566 projects light onto a screen so as to display an image. The screen is disposed in the inside or the outside of the electronic device 501. According to certain embodiments, the display 560 further includes a control circuit for controlling the panel 562, the hologram device 564, or the projector 566.

The interface 570 includes, for example, a high-definition multimedia interface (HDMI) 572, a universal serial bus (USB) 574, an optical interface 576, or a D-subminiature (D-sub) 578. The interface 570 includes, for example, a mobile high-definition link (MHL) interface, a secure digital (SD) card/multi-media card (MMC) interface, or an infrared data association (IrDA) interface.

The audio module 580 converts a sound into an electrical signal or vice versa. The audio module 580 processes sound information input or output through a speaker 582, a receiver 584, an earphone 586, or the microphone 588.

The camera module 591 for shooting a still image or a video includes at least one image sensor (such as a front sensor or a rear sensor), a lens (not illustrated), an image signal processor (ISP, not illustrated), or a flash (such as an LED or a xenon lamp, not illustrated).

The power management module 595 manages power of the electronic device 501. Although not illustrated, a power management integrated circuit (PMIC), a charger integrated circuit (IC), or a battery or fuel gauge can be included in the power management module 595.

The PMIC is mounted on an integrated circuit or an SoC semiconductor. A charging method can be classified into a wired charging method and a wireless charging method. The charger IC charges a battery, and prevents an overvoltage or an overcurrent from being introduced from a charger. According to certain embodiments, the charger IC includes a charger IC for at least one of the wired charging method and the wireless charging method. The wireless charging method includes, for example, a magnetic resonance method, a magnetic induction method or an electromagnetic method, and includes an additional circuit, for example, a coil loop, a resonant circuit, or a rectifier.

The battery gauge measures, for example, a remaining capacity of the battery 596 and a voltage, current or temperature thereof while the battery is charged. The battery 596 stores or generates electricity, and supplies power to the electronic device 501 using the stored or generated electricity. The battery 596 includes, for example, a rechargeable battery or a solar battery.

The indicator 597 indicates a specific state of the electronic device 501 or a part thereof (such as the AP 510), such as a booting state, a message state, or a charging state. The motor 598 converts an electrical signal into a mechanical vibration. Although not illustrated, a processing device (such as a GPU) for supporting a mobile TV is included in the electronic device 501. The processing device for supporting a mobile TV processes media data according to the standards of digital multimedia broadcasting (DMB), digital video broadcasting (DVB) or media flow.

Each of the above-mentioned elements of the electronic device according to the present disclosure can be configured with one or more components, and the names of the elements can be changed according to the type of the electronic device. The electronic device according to the present disclosure includes at least one of the above-mentioned elements, and some elements can be omitted or other additional elements can be added. Furthermore, some of the elements of the electronic device according to the present disclosure can be combined with each other so as to form one entity, so that the functions of the elements can be performed in the same manner as before the combination.

The term "module" used herein represents, for example, a unit including one or more combinations of hardware, software and firmware. The term "module" can be interchangeably used with the terms "unit", "logic", "logical block", "component" and "circuit". The "module" can be a minimum unit of an integrated component or can be a part thereof. The "module" can be a minimum unit for performing one or more functions or a part thereof. The "module" can be implemented mechanically or electronically. For example, the "module" according to the present disclosure includes at least one of an application-specific integrated circuit (ASIC) chip, a field-programmable gate array (FPGA), and a programmable-logic device for performing some operations, which are known or will be developed.

According to the various embodiments, at least a part of devices (such as modules or functions thereof) or methods (such as operations) according to the present disclosure are implemented with instructions stored in a computer-readable storage medium in the form of a programming module. When the instructions are performed by at least one processor, the at least one processor performs functions corresponding to the instructions. At least a part of the programming module can include, for example, a module, a program, a routine, sets of instructions, or a process for performing at least one function.

The computer-readable storage medium can include a magnetic medium such as a hard disk, a floppy disk and a magnetic tape, an optical medium such as a compact disk read only memory (CD-ROM) and a digital versatile disc (DVD), a magneto-optical medium such as a floptical disk, and a hardware device configured to store and execute program instructions (such as programming module), such as a read only memory (ROM), a random access memory (RAM) and a flash memory. The program instructions can include machine language codes made by compilers and high-level language codes that can be executed by computers using interpreters. The above-mentioned hardware can be configured to be operated as one or more software modules for performing operations of the present disclosure and vice versa.

The module or programming module according to the present disclosure can include at least one of the above-mentioned elements, or some elements can be omitted or other additional elements can be added. Operations performed by the module, the programming module or the other elements can be performed in a sequential, parallel, iterative or heuristic way. Furthermore, some operations can be performed in another order or can be omitted, or other operations can be added.

According to the various embodiments of the present disclosure, even though the rib applies the resilience to the housing, the hook of the cover can be securely fit to the coupling groove formed in the housing. Therefore, the various embodiments of the present disclosure provide an electronic device having a waterproof function and a cover thereof, the electronic device securing the cover to the housing while reducing damage to the cover.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. An electronic device including a waterproof function, the electronic device comprising:
   a housing including a coupling groove formed therein;
   a cover including a hook configured to detachably fit to the coupling groove, the cover configured to detachably couple to the housing by the hook; and
   a sealing band disposed on an inner side of the cover, the sealing band configured to contact at least a part of a surface of the housing that faces the cover when the cover is coupled to the housing,
   wherein the sealing band includes a rib extending towards the housing, at least a part of the rib being bent in a specific direction,
   wherein the sealing band is spaced apart from the hook by a specific distance without overlapping in reference to a virtual vertical line.

2. The electronic device of claim 1, wherein the sealing band is configured to surround an edge of at least a partial area of the surface of the housing.

3. The electronic device of claim 1, wherein the hook is disposed on the inner side of the cover and configured to protrude in a similar direction to an extending direction of the rib.

4. The electronic device of claim 3, wherein the cover is configured to couple to the housing with the rib being pressed and bent by the housing.

5. The electronic device of claim 3, wherein, when the hook is fit to the coupling groove, an interfacial surface between the hook and the coupling groove is configured to extend in a similar or parallel direction to the extending direction of the rib.

6. The electronic device of claim 5, wherein, when the cover is detached from the housing, the rib is configured to incline at an angle of about 60° to about 70° with respect to a plane defined by an area surrounded by the sealing band.

7. The electronic device of claim 6, wherein an angle between the interfacial surface between the hook and the coupling groove and the plane defined by the area surrounded by the sealing band is dimensioned to be about 40° to about 60°.

8. The electronic device of claim 6, wherein the rib includes a length to be pressed and bent by the housing when the cover is coupled to the housing, wherein the length of the rib is dimensioned to less than about 1.4 mm.

9. The electronic device of claim 8, wherein a height of the rib when deformed, measured from a surface of the cover when the cover is coupled to the housing, is dimensioned to be smaller than a height of the rib when not deformed, measured from the surface of the cover when the cover is detached from the housing, by about 0.25 mm to about 0.35 mm.

10. The electronic device of claim 9, wherein a height of the cover is dimensioned to be about 1.5 mm to about 2.0 mm.

11. The electronic device of claim 10, wherein a hook engagement amount is dimensioned to be about 0.15 mm to about 0.17 mm, wherein the hook engagement amount is defined as a length of the interfacial surface between the hook and the coupling groove measured along a protruding direction of the hook while the hook is fit to the coupling groove.

12. The electronic device of claim 1, wherein the sealing band is configured to form a closed curve.

13. The electronic device of claim 1, wherein at least a part of the rib is configured to bend in an opposite direction to a direction in which the hook is drawn from the coupling groove or is bent towards an inside of an area surrounded by the sealing band.

14. The electronic device of claim 1, wherein the rib is configured to apply force to the cover in a direction in which the cover is pulled from the housing while the cover is coupled to the housing, wherein the direction in which the cover is pulled from the housing intersects with a direction in which the hook is drawn from the coupling groove.

15. A cover of an electronic device including a waterproof function, the cover comprising:

a hook configured to protrude from an inner side including a flat central portion and an edge area bent at a specific angle, wherein the hook, disposed on the bent edge area, is configured to insert into a coupling groove formed in a housing of a main body; and a sealing band configured to protrude from the inner side, wherein the sealing band is spaced apart from the hook by a specific distance without overlapping in reference to a virtual vertical line, wherein the sealing band comprises a rib configured to protrude from the inner side, the rib inclined in a specific direction with respect to the inner side.

16. The cover of claim 15, further comprising an adhesive layer configured to fix the rib to the inner side.

17. The cover of claim 15, wherein at least a part of the rib is configured to bend in an opposite direction to a direction in which the hook is drawn from the coupling groove or is configured to bend towards an inside of an area surrounded by the sealing band.

18. The cover of claim 15, wherein the rib is configured to apply force to the cover in a direction in which the cover is pulled from the housing while the cover is coupled to the housing, wherein the direction in which the cover is pulled from the housing intersects with a direction in which the hook is drawn from the coupling groove.

19. The cover of claim 15, wherein the rib is configured to incline at an angle of about 60° to about 70° with respect to a plane defined by an area surrounded by the sealing band while the cover is detached from the housing, and a height of the rib when deformed, is dimensioned to measure from the inner side of the cover when the cover is coupled to the housing, less than a height of the rib measured before the rib is deformed, by about 0.25 mm to about 0.35 mm.

20. The cover of claim 19, wherein a height difference between an end of the edge area and the central portion due to bending of the cover is about 1.5 mm to about 2.0 mm.

* * * * *